United States Patent [19]

Naven et al.

[11] Patent Number: 4,701,916
[45] Date of Patent: Oct. 20, 1987

[54] DIGITAL INTEGRATED CIRCUIT WITH MULTI-MODE REGISTER

[75] Inventors: Finbar Naven, Cheadle Hulme; Stuart G. Hale, Denton, both of Great Britain

[73] Assignee: International Computers Limited, London, England

[21] Appl. No.: 840,602

[22] Filed: Mar. 17, 1986

[30] Foreign Application Priority Data

Mar. 23, 1985 [GB] United Kingdom ............... 8507612
Jul. 25, 1985 [GB] United Kingdom ............... 8518857

[51] Int. Cl.$^4$ .......................................... G01R 31/28
[52] U.S. Cl. ................................. 371/15; 324/73 R; 371/25
[58] Field of Search ............... 371/25, 15; 324/73 R, 324/73 AT

[56] References Cited

U.S. PATENT DOCUMENTS

| 4,317,200 | 2/1982 | Wakatsuki et al. | 371/25 |
| 4,476,431 | 10/1984 | Blum | 324/73 R |
| 4,498,172 | 2/1985 | Bhavsar | 371/25 |
| 4,513,418 | 4/1985 | Bardell, Jr. et al. | 371/25 |
| 4,519,078 | 5/1985 | Komorytsky | 371/25 |
| 4,534,028 | 8/1985 | Trischler | 371/25 |
| 4,567,593 | 1/1986 | Bashaw | 371/25 |
| 4,635,261 | 1/1987 | Anderson et al. | 371/25 |

OTHER PUBLICATIONS

Konemann et al., Built-in Test for Complex Digital Integrated Circuits, Fifth European Solid State Circuits Conference, ESSCIRC 79, Southampton, England, (Sep. 18-29, 1979) pp. 89-90.

Bhavsar et al., Self-Testing by Polynomial Division, Digest of Papers, 1981 Intl. Test Conference, IEEE, pp. 208-216.

Primary Examiner—Charles E. Atkinson
Attorney, Agent, or Firm—Lee, Smith & Zickert

[57] ABSTRACT

A digital integrated circuit comprises a number of registers each of which comprises several data bits and at least one control bit cell. In a normal operation state, all the registers act as parallel input/output registers. In a SHIFT state, the data bits and control bit cells of all the registers are linked together to from a serial shift path between a pair of external terminals allowing test data to be shifted in or out as required. In a TEST state, each register is set into one of a number of test modes, controlled by the test bit cells of that register. The test modes include a test generate mode in which the register acts as a pseudo-random number generator, and a test analyze mode in which it acts as a digital signature analyzer.

6 Claims, 5 Drawing Figures

DIGITAL INTEGRATED CIRCUIT WITH MULTI-MODE REGISTER

This invention relates to digital integrated circuits.

A digital integrated circuit generally includes a number of multi-bit registers for holding data, instructions or addresses. These are connected to other functional parts of the integrated circuit and are normally operated as parallel input/output buffers.

Such a circuit may be difficult to test, since the registers may be inaccessible from the external terminals of the integrated circuit chip. One way of overcoming this problem is to provide a special test mode of operation in which all the registers on the chip are converted into serial input/output shift registers and are connected together in series to form one or more serial shift paths between a pair of terminals in the chip. This allows test data to be loaded into the registers and allows test results to be read out of the registers using only a minimum number of extra terminals on the chip. This is described, for example, in British patent No. 1536147.

Each register may have other modes of operation in addition to the normal parallel load mode and serial shift mode described above. For example, the register may be operable as a feedback shift register, for generating pseudo-random test patterns for testing the chip. This is described, for example, in U.S. Pat. No. 3961252.

Alternatively, the register may be operable as a signature analyser for compressing a series of test results to form a digital signature for diagnostic purposes. Another possible mode is a "hold" mode in which the contents of the register are held or frozen at their existing value, irrespective of any inputs applied to the register. Other modes are also possible.

A problem with this is that several extra input lines would normally be required to receive control signals for selecting between these different modes. This is undesirable since it increases the number of paths required on the chip and can lead to difficulties in providing all the necessary connections.

The object of the present invention is therefore to overcome this problem, by providing a digital integrated circuit including a register, in which the number of extra input paths to the register required to select different modes of operations is reduced.

SUMMARY OF THE INVENTION

According to the invention, there is provided a digital integrated circuit including at least one register having a shift mode in which the individual bits of the register are connected in series as part of a shift path between a pair of external terminals, wherein the circuit includes at least one control bit cell connected in the serial shift path in series with the register, the control bit cell or cells providing one or more control signals for selecting further modes of operation of the register.

It can be seen that the control bit cell or cells can be loaded over the serial shift path, using the shift mode. Hence, the control signals produced from these cells do not require any special input lines.

One embodiment of the invention will now be described by way of example with reference to the accompanying drawings.

DETAILED DESCRIPTION

Figure 1:
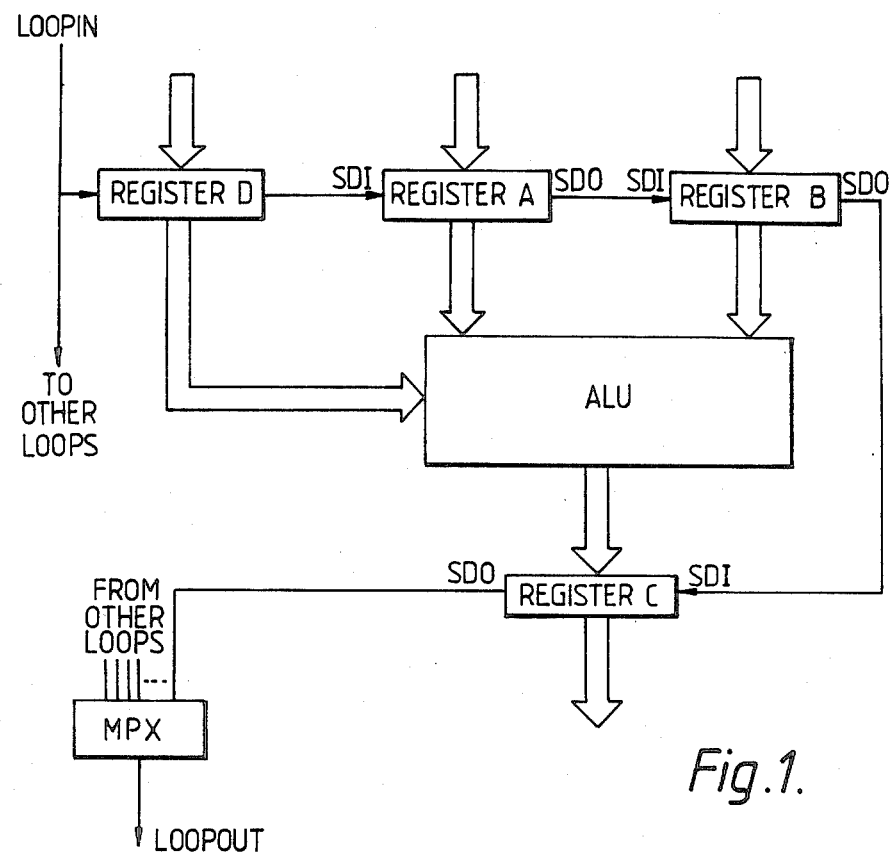
FIG. 1 is a block circuit diagram of a portion of a digital integrated circuit chip in accordance with the invention.

Referring to FIG. 1, this shows a portion of a very large scale integrated circuit (VLSI) chip. The chip includes an arithmetic and logic unit ALU, having input registers A and B, an output register C, and a control register D which controls the mode of operation of the ALU.

In the normal operation, each of the registers A-D acts as a conventional buffer register with parallel input and output. As will be described, each register can also be operated in a shift mode in which it acts as a shift register, allowing data to be shifted into it by way of a serial data input SDI and shifted out by way of a serial data output SDO. As shown, the registers A-D are connected in series by means of these serial input and output terminals, to form a serial shift path or loop, extending between a loop data input pin LOOPIN and a loop data output pin LOOPOUT. The chip also contains other similar loops (not shown) connected in parallel with the loop shown, by means of a multiplexer MPX which can select the output of any one of the loops for connection to the LOOPOUT pin.

Figure 2:
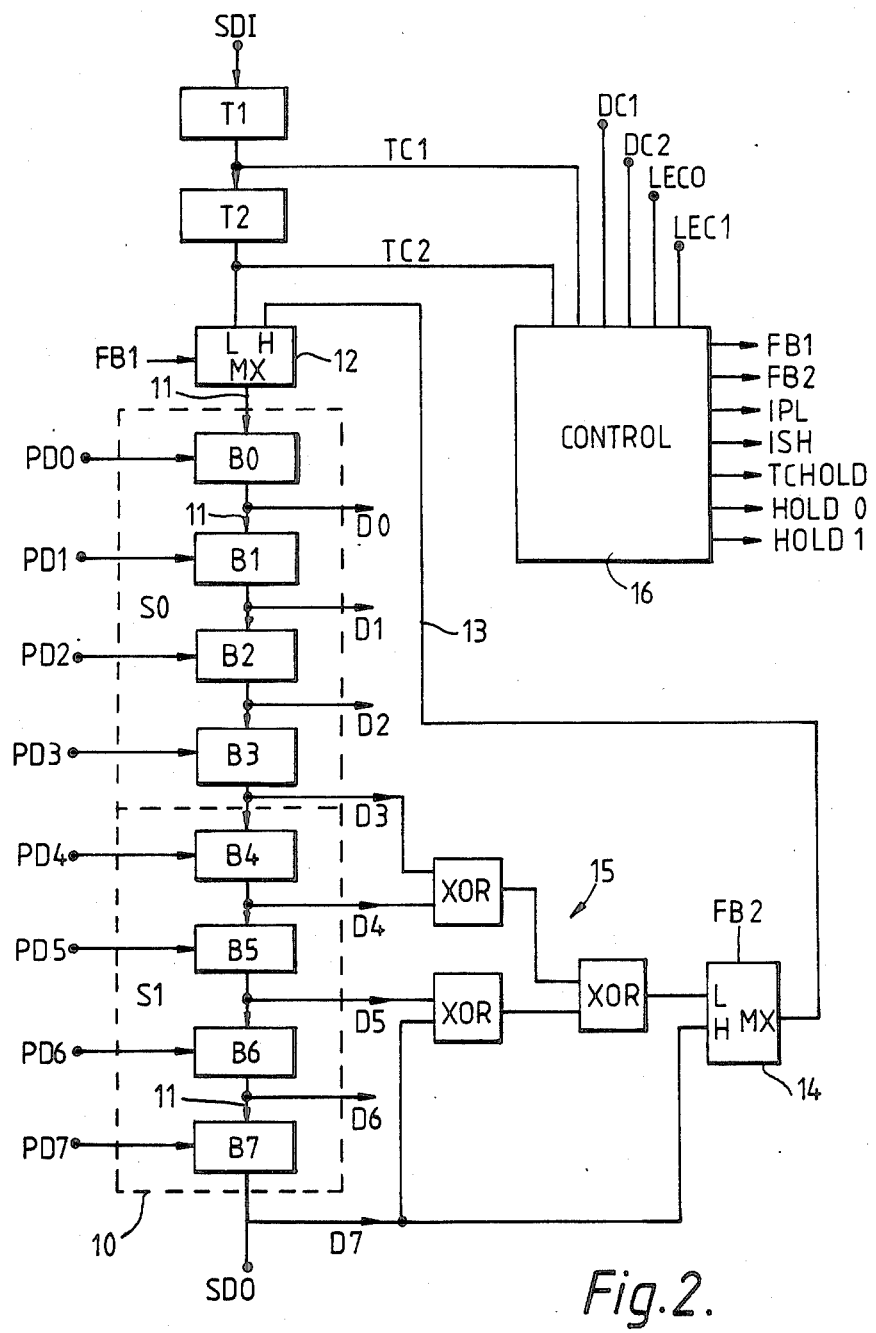
FIG. 2 is a circuit diagram of a register forming part of the chip.

Referring to FIG. 2, this shows one of the registers in more detail. The register 10 includes eight bit cells B0–B7 arranged in two sections S0, S1 each section containing four cells. The cells have respective data inputs PD0–PD7 and data outputs DO–D7 for parallel input and output of data. These parallel inputs and outputs are the normal inputs and outputs of the register when it is serving its normal function as part of the data-flow on the chip and are connected as shown in FIG. 1. In this normal mode of operation, the sections are controlled individually by load enable control signals LEC0, LEC1 which enable data to be loaded in parallel into the respective sections S0, S1 from the inputs PD0–PD3 and PD4–PD7.

Each cell also has a serial data input 11. The output of each cell B0–B6 is fed to the serial input 11 of the next cell, so as to connect all the cells B0–B7 together in series as a shift register. The output from the last bit cell B7 is connected to the serial data output SD0 of the register. The register also contains two test control bit cells T1, T2. These are connected in series between the serial data input SD1 of the register and the serial input 11 of bit cell B0, by way of a multiplexer 12.

The multiplexer 12 is controlled by a signal FBl. When FBl is low the multiplexer selects the output of bit cell T2. This causes the cells/T1, T2, B0–B7 all to be connected together as a serial shift register between the terminals SD1 and SD0. When FB1 is high, the multipleser 12 selects a feedback path 13. This path comes from a further multiplexer 14, controlled by a signal FB2.

When FB2 is low, the multiplexer 14 selects the output of an exclusive -OR gate tree 15, and when FB2 is high, it selects the output of the last bit cell B7. The exclusive -OR gates 15 are connected to the outputs of bit cells B3, B4, B5 and B7 as shown, so as to form the exclusive -OR function (modulo - 2 sum) of these outputs.

The register has a control circuit 16 which receives the following input signals:

(a) Mode control signals DC1, DC2. These are common to all the registers A–D in the loop.

(b) Mode control signals TC1, TC2 from the test control bit cells T1, T2 of the register.

(c) The load enable control signals LEC0, LEC1.

The control circuit 16 produces the following circuit signals:

(a) The signals FB1, FB2 which control the multiplexers 12,14.

(b) Signals IPL and ISH which are fed in common to all the bit cells B0–B7.

(c) A signal TCHOLD which is fed to both the test control bit cells T1, T2.

(d) Signals HOLD0 and HOLD1 which are fed respectively to sections S0 and S1.

Figure 3:
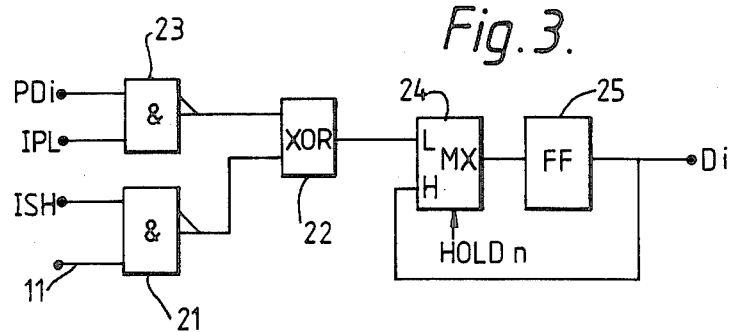
FIG. 3 is a logic diagram of a bit cell of the register.

Referring not to FIG. 3, this shows one of the bit cells Bi (where i=0,1-7) in section Sn (where n=0 or 1).

The serial data input 11 of the cell is connected to a NAND gate 21, controlled by the signal ISH. The output of this gate is fed to one input of an exclusive -OR gate 22. the other input of which is connected to the output of a NAND gate 23. The gate 23 receives the parallel data input PDi for the cell, and is controlled by the signal IPL.

Thus, when ISH is high and IPL is low, the output of gate 22 is equal to the data received at the serial input 11. When ISH is low and IPL high, the output of gate 22 is equal to the parallel data bit PDi. If both ISH and IPL are high, the output of the gate 22 is the exclusive -OR of the serial and parallel data inputs.

The output of the gate 23 is connected to one input of a multiplexer 24, the output of which is fed to the data input of a flip-flop (bistable circuit) 25. The output of the flip-flop is connected to the other input of the multiplexer 24, and also to the data output Di of the cell.

The multiplexer 24 is controlled by the signal HOLDn. When HOLDn is high, the multiplexer selects the output of the flip-flop 25, causing its current contents to be fed back to its input. Thus, the flip-flop is held frozen in its current state, regardless of the condition of its input data signals. When HOLDn is low, the multiplexer 24 selects the output of the exclusive -OR gate 22, and this allows either the serial input data, the parallel input data, or their exclusive -OR function to be clocked into the flip-flop 25.

The flip-flop 25 is a master-slave flip-flop controlled by a two-phase clock. Such flip-flops are well known and so it is not necessary to describe it in detail.

Figure 4:
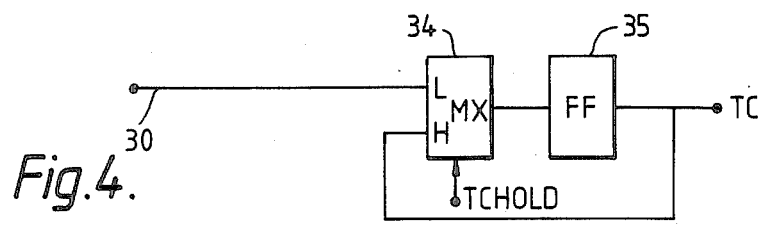
FIG. 4 is a logic diagram of a test bit cell associated with the register.

Referring now to FIG. 4, this shows one of the test control bit cells T1, T2. The cell consists of a multiplexer 34 and flip-flop 35 connected in a similar manner to those in FIG. 3. The multiplexer 34 is controlled by the signal TCHOLD. When TCHOLD is low, the multiplexer selects the serial input path 30 of the cell, allowing data to be shifted serially into the flip-flop 35. When TCHOLD is high, the multiplexer selects the output of the flip-flop, thereby causing the current state of the flip-flop to be frozen.

OPERATION

The register has seven modes of operation, specified by the control signals DC1, DC2, TC1 and TC2 as follows:

| DC1 | DC2 | TC1 | TC2 | Mode |
| --- | --- | --- | --- | --- |
| H | H | — | — | CHIP HOLD |
| L | H | — | — | SHIFT |
| H | L | — | — | USER |
| L | L | L | L | TEST HOLD |
| L | L | L | H | TEST ANALYSE |
| L | L | H | L | TEST SLIDE |
| L | L | H | H | TEST GENERATE |

In the CHIP HOLD mode, the signals HOLD0, HOLD1, and TCHOLD are held high. Thus, the contents of all the bit cells B0–B7 and both the test control bit cells T1, T2 are frozen, and cannot be shifted or overwritten.

In the SHIFT mode, the signals HOLD0, HOLD1 and TCHOLD are held low, ISH is held high, and IPL is held low. Thus, in this mode, data is shifted along the serial shift path through all the cells T1; T2, B0–B7, between the terminals SDI and SD0. This mode can be used to set the test control bit cells T1, T2 to any desired value, and also to load test data into the bit cells B0–B7 or to read test results from those cells.

The USER mode is the normal mode of operation, when the register is serving its normal function as a parallel input/output register. In this mode, IPL is held high, ISH is held low, and the signals HOLDn are controlled directly by the load enable control signals LECn. Thus, when LECn is high, HOLDn is also high, and this causes the contents of the bit cells in the corresponding section Sn to be frozen. When LECn is low, HOLDn is also low, and this allows data to be loaded in parallel into the corresponding section Sn from the data inputs PD0-3 or PD4-7. TCHOLD is always held high in this mode and hence the contents of the test control bit cells T1, T2 are frozen.

In the TEST HOLD mode, the signals HOLD0, HOLD1 and TCHOLD are all held high, so as to freeze the contents of all the bit cells B0–B7, T1 and T2.

In the TEST SLIDE mode, HOLD0, HOLD1 are set low, TCHOLD is high, ISH is high and IPL is low. This allows data to be shifted serially through the bit cells B0–B7 but not through the test control bit cells T1, T2. Also, FB1 and FB2 are both held high, so that the multiplexers 12, 14 are switched to select the serial output from the last stage B7 as the serial input to B0. Hence, in this mode, the register is connected as a circular shift register, allowing its contents to be rotated. This mode is useful for producing sequences of sliding test patterns. For example, if the register is initially loaded with the pattern 0000 0001, the TEST SLIDE mode can be used to rotate this pattern so that the "1" appears successively in each bit position.

In the TEST GENERATE mode, the signals HOLD0, HOLD1 TCHOLD, ISH, IPL, and FB1 all have the same values as in the TEST SLIDE mode. However, in this case, FB2 is held low. The multiplexers 12, 14 are therefore now set to select the output of the exclusive -OR gates 15 as the serial input to the bit cell 80. Hence, in this mode, the register acts as a feedback shift register, for generating sequences of pseudo-random numbers, for use as test patterns.

In the TEST ANALYSE mode, the signals HOLD0, HOLD1, TCHOLD, ISH, FB1 and FB2 are the same as in the TEST GENERATE mode. However, in this case, IPL is held high. Thus, the input parallel data PD0-PD7 is combined in the exclusive -OR gates 22 with the shifting data within the register. In this mode, therefore, the register acts as a signature analyser, generating a digital signature from a sequence of parallel inputs. This signature can then be read out, using the SHIFT mode, and used for diagnostic purposes to detect and identify faults in the chip.

CONTROL CIRCUIT

Figure 5:
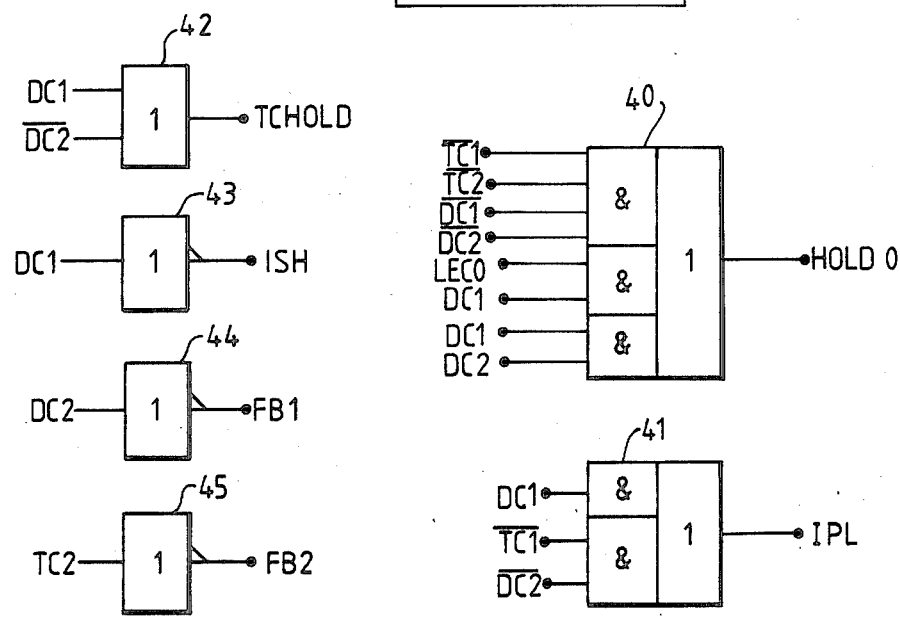
FIG. 5 is a logic diagram of a control circuit associated with the register.

Referring now to FIG. 5, this shows the control circuit 16 in detail.

The signal HOLD0 is produced by an AND/OR gate combination 40 as shown. HOLD1 is produced by a similar logic combination not shown.

IPL is produced by an AND/OR gate combination 41. TCHOLD is produced by an OR gate 42. ISH, FB1 and FB2 are produced by inverters 43, 44 and 45.

OVERALL OPERATION OF THE CHIP

As mentioned above, the chip may contain several loops similar to that shown in FIG. 1, and each of these loops may contain one or more registers connected in series.

The chip has four operational states; HOLD, SHIFT, RUN and SELF TEST.

In the HOLD state, the signals DC1 and DC2 are held high for all the loops, and hence all the registers in the chip are put into the HOLD mode. This freezes the entire contents of the chip.

In the SHIFT state, the signals DC1 and DC2 are again held high for all the loops except for one selected loop. For this selected loop, the signal DC1 is pulsed low for one clock beat at a time. This puts the selected loop into the SHIFT mode for one clock beat, allowing its contents to be shifted by one step. Otherwise, this loop reverts to the HOLD mode.

In the RUN state, the signal DC1 is held high and DC2 is held low for all the loops. Hence, all the registers are put into the USER mode.

In the SELF TEST state, the signals DC1 and DC2 are both held low for all the loops. Hence, each register is put into one of the four test modes according to the values of its individual test control bits TC1 and TC2. These bits will have been previously set to the required values by shifting data into the test control bit cells T1, T2 using the SHIFT mode.

Thus, in the SELF TEST state, the chip can perform various self-test operations to test its internal circuits. For example, if it is required to test the ALU (FIG. 1), the registers A and B can be set to the TEST GENERATE mode, register C to the TEST ANALYSE mode, and register D to the TEST HOLD mode. For testing the other circuits (not shown) on the chip, the registers could be set to other modes as required.

CONCLUSION

It can be seen that in the register described above there are four mode control signals DC1, DC2, TC1 and TC2. Only two of these (DC1, DC2) require special input paths; the other two (TC1, TC2,) are supplied by the test control bit cells T1, T2 and can therefore be loaded over the serial shift path by way of the terminal SDI. Hence, these bits require no special input paths, and so in this case, the invention reduces the required number of input paths to the register by two.

It should be noted that the SHIFT mode is selected solely by the signals DC1, DC2 and does not require signals TC1, TC2. This allows the SHIFT mode to be used for loading the test control bits. Also, it should be noted that the test control bit cells are frozen in all other modes.

It will be appreciated that in other embodiments of the invention, the number of data bits and test control bits may be varied. Also, the number of sections into which the register is divided may be varied.

Where the register contains a different number of bits, the feedback connections through the exclusive -OR gates may be different. For example, if the register has sixteen bit cells B0-B15, the exclusive -OR gates 15 would preferably be connected to the output of bits B9, B11, B14 and B15.

We claim:

1. A digital integrated circuit comprising:
   (a) a register having a plurality of modes of operation, the register having at least one control input for selecting said modes, a serial data input, and a serial data output,
   (b) external input and output terminals, and
   (c) a serial shift path connected between said external terminals, the register being connected in series in said serial path by means of said serial data input and serial data output, wherein the improvement comprises:
   (d) at least one control bit cell having a serial data input and a serial data output, the control bit cell being connected in series in said serial shift path by means of said serial data input and serial data output of the control bit cell, and the serial data output of the control bit cell being connected to said control input of the register.

2. A circuit according to claim 1 wherein said register comprises a plurality of data bit cells connected together in series between said serial data input and serial data output of the register.

3. A circuit according to claim 1 wherein said modes of operation comprise a user mode in which the register acts as a parallel input/output register, a shift mode in which the register acts as a shift register for shifting data serially between said serial data input and serial data output of the register, a test generation mode in which the register acts as a linear feedback shift register, and a test analyze mode in which the register acts as a digital signature analyzer.

4. A digital integrated circuit comprising:
   (a) a plurality of registers, each register having a plurality of modes of operation, and each register having at least one control input for selecting said modes, a serial data input, and a serial data output,
   (b) external input and output terminals, and
   (c) a serial shift path connected between said external terminals, each of said registers being connected in series in said serial shift path by means of its serial data input and serial data output,
   wherein the improvement comprises:
   (d) at least one control bit cell for each of said registers, each control bit cell having a serial data input and a serial data output, the control bit cells being connected in series in said serial shift path by means of the serial data inputs and serial data outputs of the control bit cells, and the serial data outputs of each control bit cell being connected to the control input of a respective one of the registers.

5. A circuit according to claim 4 wherein each of said registers also has at least one further control input, which is connected to receive a control signal common to all said registers.

6. A digital integrated circuit including a register comprising a plurality of data bit cells, each data bit cell having a data input and a data output, said data bit cells being connected together in series by means of connections between the data outputs and data inputs of respective cells, an exclusive-OR network, having inputs connected to the data outputs of selected ones of said cells, and having an output, and a multiplexer having a first input connected to the output of the exclusive-OR network, a second input connected to the output of a last data bit cell in said series, and an output connected to the input of a first data bit cell in said series.

* * * * *